(12) United States Patent
Silverbrook

(10) Patent No.: US 6,425,971 B1
(45) Date of Patent: Jul. 30, 2002

(54) METHOD OF FABRICATING DEVICES INCORPORATING MICROELECTROMECHANICAL SYSTEMS USING UV CURABLE TAPES

(75) Inventor: Kia Silverbrook, Balmain (AU)

(73) Assignee: Silverbrook Research Pty Ltd, Balmain (AU)

(*) Notice: Subject to any disclaimer, the term of this patent is extended or adjusted under 35 U.S.C. 154(b) by 0 days.

(21) Appl. No.: 09/567,951

(22) Filed: May 10, 2000

(51) Int. Cl.[7] .............................. B32B 31/16; C04J 5/00; H01L 21/00; H01L 21/463; H01L 21/77
(52) U.S. Cl. .................. 156/230; 156/241; 156/247; 156/250; 156/257; 156/153; 156/306.6; 428/42.3; 427/150; 438/48; 438/113; 438/458; 438/459; 438/464; 438/977
(58) Field of Search .................. 156/230, 247, 156/241, 248, 249, 154, 275.5, 275.1, 272.2, 334, 60, 153, 250, 257, 306.6; 428/200, 620, 42.3, 343; 438/106, 110, 113, 114, 116, 118, 460, 464, 468, 463, 48, 50, 107, 458, 459, 977; 427/150

(56) References Cited

U.S. PATENT DOCUMENTS 5,187,007 A * 2/1993 Ebe et al. ............ 428/343
5,476,566 A   12/1995 Cavasin
5,605,489 A * 2/1997 Gale et al. ............ 451/28
5,923,995 A   7/1999 Kao et al.
6,010,782 A * 1/2000 Uemura et al. ........ 428/343
6,245,593 B1   6/2001 Yoshihara et al.
6,297,131 B1 * 10/2001 Yamada et al. ........ 438/464
6,320,266 B1 * 11/2001 Hatchard et al. ....... 257/778

FOREIGN PATENT DOCUMENTS

| DE | 19957111 A1 | 5/2000 | |
|---|---|---|---|
| JP | 07-022358 A | * 1/1995 | ...... H01L/21/301 |
| JP | 08-281954 A | 10/1996 | |
| JP | 11-204551 A | 7/1999 | |

* cited by examiner

Primary Examiner—J. A. Lorengo

(57) ABSTRACT

A method of fabricating devices incorporating microelectromechanical systems (MEMS) using UV curable tapes includes providing a silicon substrate 12 with a MEMS layer 14 arranged on one side of the substrate 12. A first UV curable tape 22 is applied to the MEMS layer 14. At least one operation is performed on the substrate 14 via an opposed side of the substrate 14. A second UV curable tape 32 is applied to the opposed side of the substrate 14 and the first tape 22 is removed by exposing it to UV light. At least one operation is performed on the MEMS layer to form individual MEMS chips which are able to be removed individually from the second UV tape 32 by localized exposure of the tape 32 to UV light.

2 Claims, 5 Drawing Sheets

METHOD OF FABRICATING DEVICES INCORPORATING MICROELECTROMECHANICAL SYSTEMS USING UV CURABLE TAPES

FIELD OF THE INVENTION

This invention relates to the fabrication of devices incorporating microelectromechanical systems (MEMS). More particularly, the invention relates to a method of fabricating MEMS devices using UV curable tapes. For the sake of brevity, such a device shall be referred to below as a MEMS device and the part of the device comprising the microelectromechanical system shall be referred to as a MEMS layer.

SUMMARY OF THE INVENTION

According to the invention, there is provided a method of fabricating MEMS devices, the method including the steps of:

providing a substrate with a MEMS layer arranged on one side of the substrate;

applying a first holding means to the MEMS layer;

performing at least one operation on the substrate from a side of the substrate opposed to the side having the MEMS layer;

applying a second holding means to said opposed side of the substrate;

removing the first holding means;

performing at least one operation on the MEMS layer to define individual MEMS chips, each chip being composed of a part of the substrate and at least one part of the MEMS layer; and causing the individual chips to be released from the second holding means for removal from the second holding means.

Preferably, the method includes bonding the first holding means to the substrate. Optionally, a handling means may be applied to the first holding means. The handling means may impart rigidity to the holding means and may facilitate manipulation of a laminate, the laminate comprising the substrate and the MEMS layer.

The operations performed on the substrate may include at least one of thinning the substrate and etching the substrate from the opposed side of the substrate to divide the substrate into individual chips.

Further, the operations performed on the MEMS layer may consist of removing sacrificial material from the layer to release individual MEMS chips. The MEMS chip may comprise a part of the substrate and at least one MEMS element or component.

In a preferred embodiment of the invention, the method may include applying the second holding means to the substrate before removal of the first holding means.

The second holding means may also be bonded to the substrate. Both the first holding means and the second holding means may be in the form of tapes which have adhesives which are curable by exposure to ultraviolet (UV) light. By "curable" is meant that the adhesive loses its adhesive properties when exposed to UV light. Thus, the method may include exposing localised regions of the second holding means to the UV light to release one MEMS chip at a time from the second holding means to enable each MEMS chip to be removed individually from the second holding means.

Optionally, the method may include applying a handling means to the second holding means. The handling means may be transparent to the UV light so that the UV light is transmitted through the handling means to cure the adhesive of the second holding means.

Each handling means may be in the form of a glass, quartz, alumina or equivalent wafer.

The method may finally include removing each chip from the second holding means by a transporting means.

BRIEF DESCRIPTION OF THE DRAWINGS

The invention is now described by way of example with reference to the accompanying diagrammatic drawings in which.

DETAILED DESCRIPTION OF THE INVENTION

Figure 1:
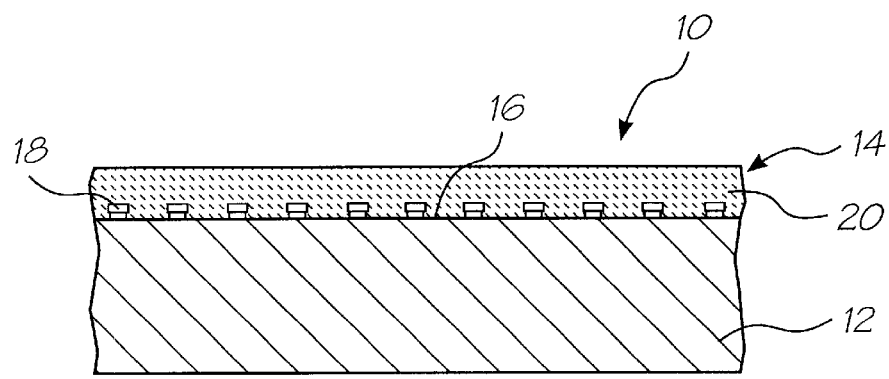
FIGS. 1 to 10 show various stages in a method of fabricating MEMS devices, in accordance with the invention.

In an initial step, illustrated at 10 in FIG. 1 of the drawings, of a method of fabricating a MEMS device, in accordance with the invention, a silicon substrate or wafer 12 is provided. The wafer 12 carries a surface macromachined MEMS layer 14 on a first surface 16 of the wafer 12.

The MEMS layer 14 has a plurality of MEMS elements or chips 18 interposed in one or more sacrificial layers 20.

Figure 2:
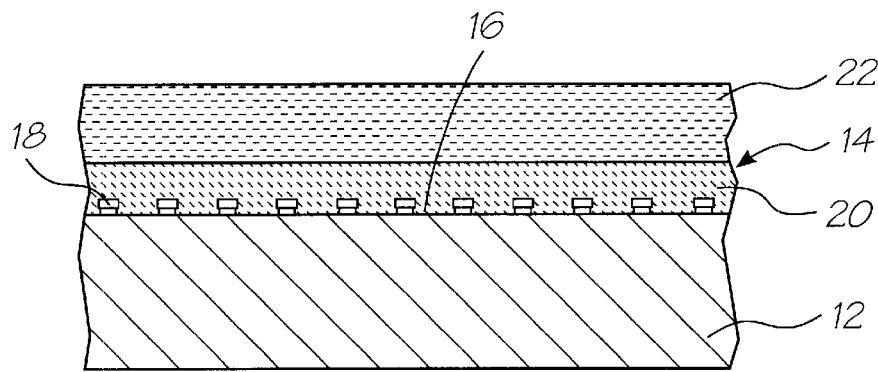
Figure 3:
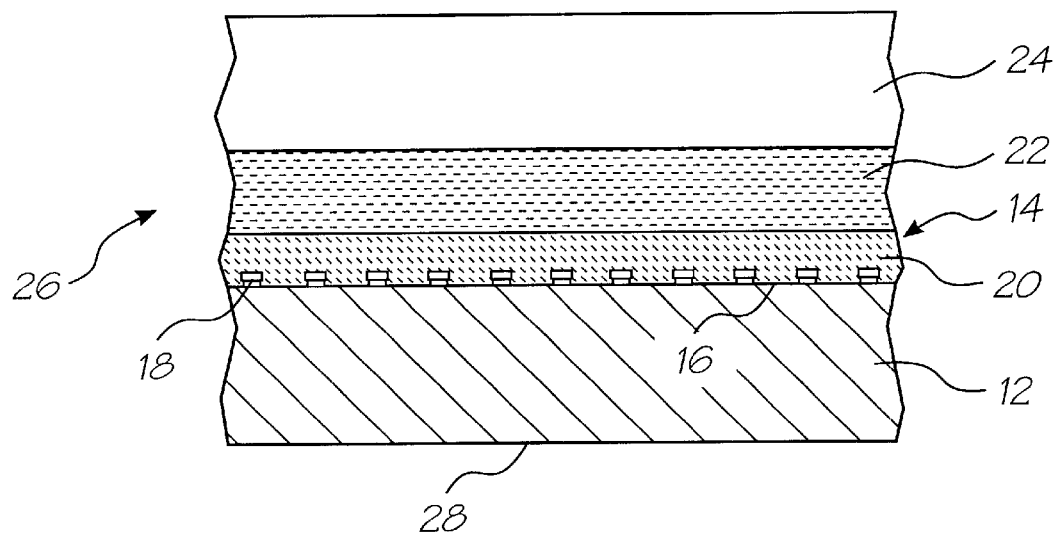

A first holding means, in the form of an adhesive tape 22, is bonded to the MEMS layer 14 as illustrated in FIG. 2 of the drawings. The tape 22 is bonded to the layer 14 by means of a curable adhesive. The adhesive is curable in the sense that it loses its adhesive properties or "tackiness" when exposed to ultraviolet (UV) light.

Depending on the equipment used, a handling means in the form of a glass, quartz, alumina or other transparent handle wafer 24 is secured to the tape 22.

A laminate 26, comprising the silicon wafer 12, the MEMS layer 14, the tape 22 and the glass wafer 24 is then turned over to expose an opposed side 28 of the silicon wafer 12.

Figure 4:
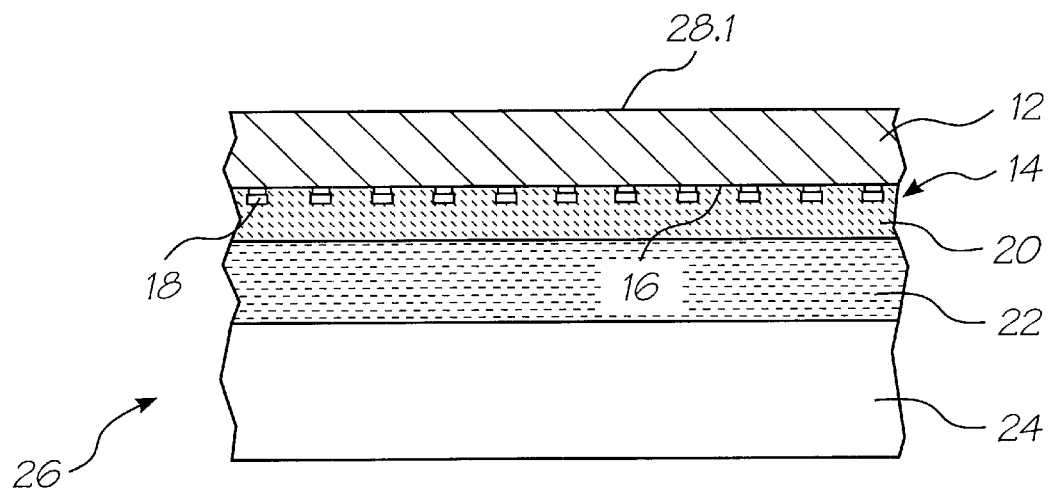

A first operation is performed on the silicon wafer 12 by back grinding the surface 28 of the silicon wafer 12 to thin the wafer 12 as illustrated in FIG. 4 of the drawings. This reduces the etch time of the silicon wafer 12.

Figure 5:
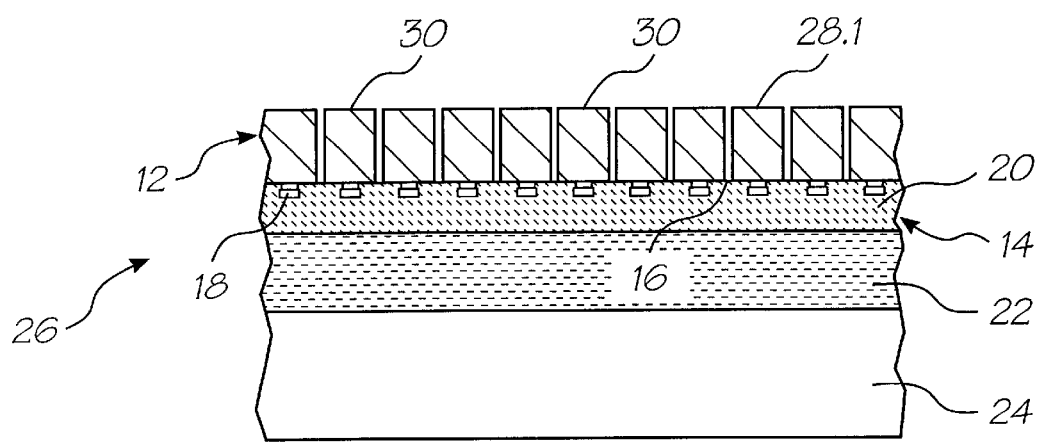
Figure 6:
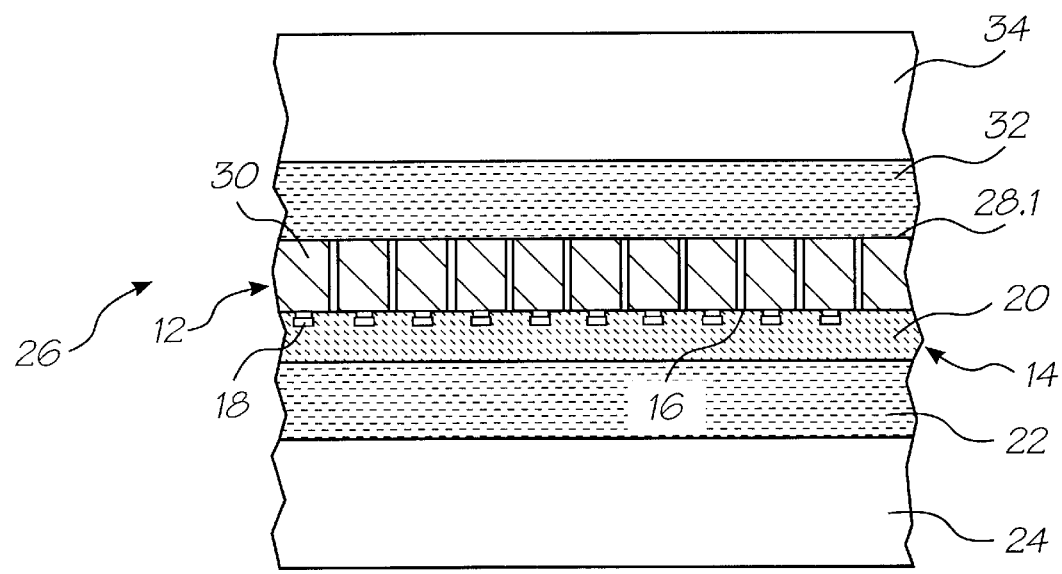

Then, as shown in FIG. 5 of the drawings, the silicon wafer 12 is deep silicon etched right through the wafer from the reverse side of the wafer to dice the wafer 12 to form individual chips 30. In this figure, each chip 30 has one MEMS element 18 associated with it but it will be appreciated that each chip 30 could, if desired, contain an array of MEMS elements.

A second holding means in the form of a second tape 32 is applied to the surface 28.1 of the silicon wafer 12. Once again, optionally, a second transparent handle wafer 34 is applied to the tape 32, depending on the equipment being used. The tape 32 is bonded to the surface 28.1 of the wafer 12 by means of an adhesive which is also curable when exposed to UV light.

Figure 7:
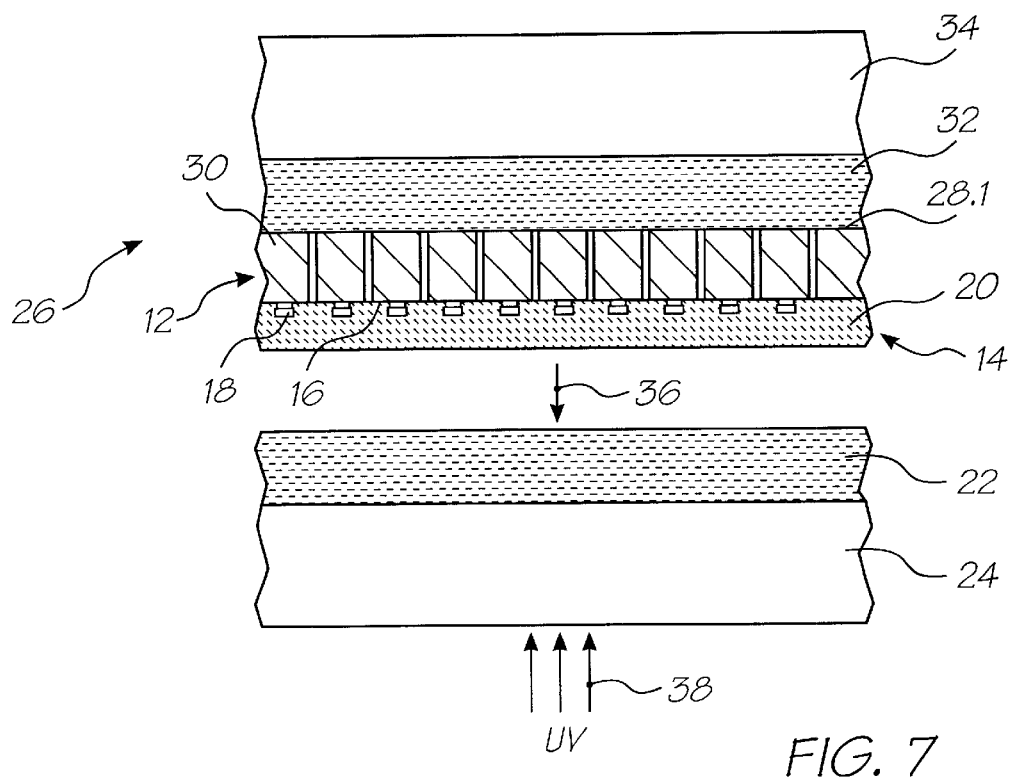
Figure 8:
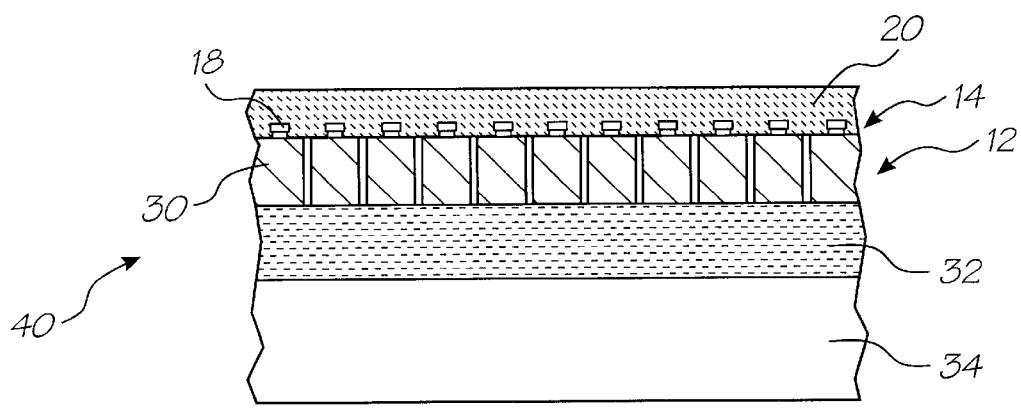
Figure 9:
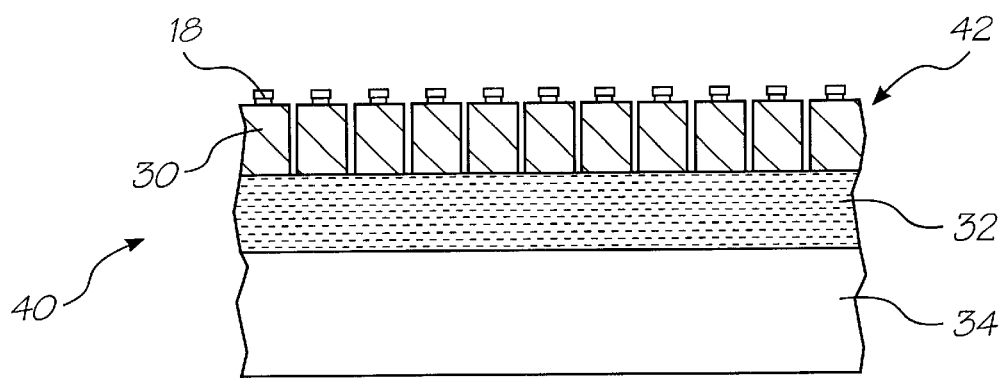

The first tape 22 and the glass wafer 24 are removed, as illustrated schematically by arrow 36 in FIG. 7 of the drawings, after application of the tape 32. The tape 22 is removed by exposing it to UV light which is projected on to the tape 22 through the glass layer 24 as illustrated by arrows 38. It will be appreciated that the glass wafer 24 is transparent to the UV light. In contrast, the silicon wafer 12 is opaque to the UV light so that the tape 32 on the other side of the wafer 12 is not affected by the UV light when the tape 22 is exposed to the UV light.

Once the tape 22 and glass wafer 24 have been removed, a new laminate 40, comprising the silicon wafer 12, the MEMS layer 14, the tape 32 and the glass wafer 34 is turned over to expose the sacrificial layer 20 of the MEMS layer 14.

Figure 10:
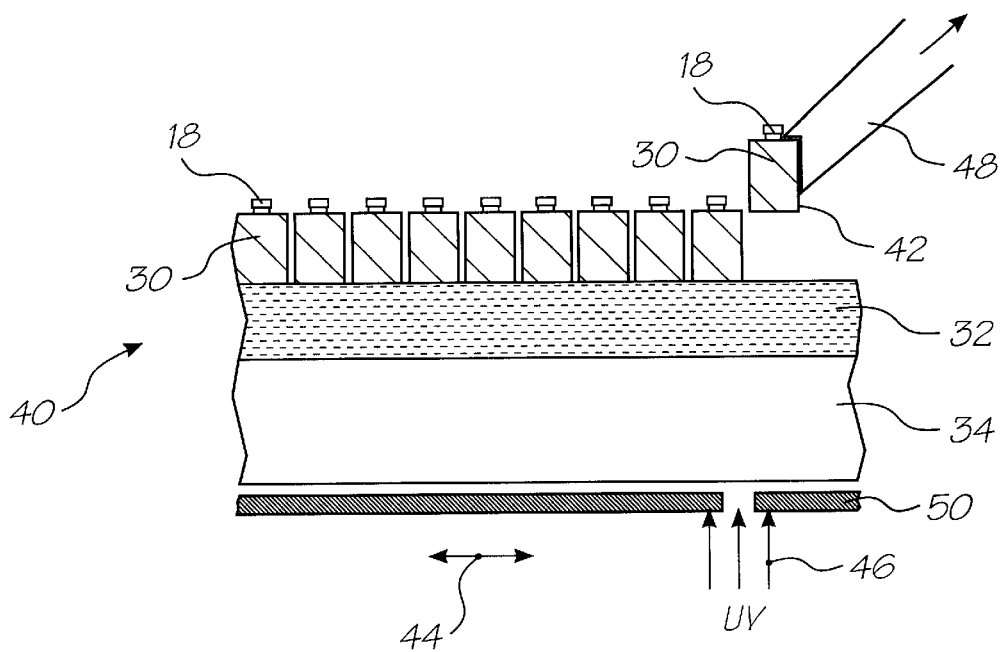

The sacrificial layer 20 is then removed by etching or by oxygen plasma techniques. This releases the MEMS elements 18, and completes the separation of the chips 42. The laminate 40 is placed on an xy wafer stage (not shown) which is reciprocated, as illustrated by arrow 44 in FIG. 10 of the drawings. Each MEMS chip 42, when it is desired to remove it, is exposed to UV light as indicated by arrows 46 through a mask 50. This cures the adhesive of the tape 32 locally beneath one particular MEMS chip 42 at a time, to enable that MEMS chip 42 to be removed from the tape 32 by means of a transporting means which may include a vacuum pickup 48.

An example of the application of the invention, is in the fabrication of ink jet printheads. In this example, the MEMS elements 18 comprise nozzle assemblies. Each assembly comprises an ink ejection nozzle and an actuator for controlling ink ejection.

Hence, it is an advantage of the invention, that a method of fabrication is provided which facilitates the performing of various operations to fabricate the individual MEMS chips and which facilitates removal of the MEMS chips 42 for packaging.

The manufacturing process facilitates that the MEMS devices 18 are not touched by solids or liquids after they are released by the release etch.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

I claim:

1. A method of fabricating MEMS devices from a substrate wafer having a series of MEMS devices positioned within a layer of sacrificial material on one side of the substrate wafer, the method comprising the steps of:

applying a first UV curable adhesive tape to the layer of sacrificial material;

applying a first transparent handle wafer to the first adhesive tape;

performing a wafer thinning operation on a side of the substrate wafer opposed to the side having the layer of sacrificial material;

performing a deep silicon etching operation on said opposed side of the substrate wafer to dice the substrate wafer into chips, so that each chip carries a MEMS device;

applying a second UV curable tape to said opposed side of the substrate;

applying a second transparent handle to the second adhesive tape;

illuminating the first adhesive tape through the first transparent handle wafer to remove the first adhesive tape and the first transparent handle wafer;

performing a removal operation on the layer of sacrificial material to remove the sacrificial material and thus to define individual MEMS elements, each EMS element being composed of one of the MEMS devices positioned on a respective chip; and illuminating the second adhesive tape through the second transparent handle wafer so that the elements are released from the second adhesive tape and the second transparent handle wafer.

2. A method as claimed in claim 1, in which the step of illuminating the second adhesive tape includes exposing localised regions of the second adhesive tape to UV light to release one MEMS element at a time from the second adhesive tape and the second transparent handle so that each chip can be removed individually from the second adhesive tape and the second transparent handle.

* * * * *

UNITED STATES PATENT AND TRADEMARK OFFICE
CERTIFICATE OF CORRECTION

PATENT NO.    : 6,425,971 B1
DATED         : July 30, 2002
INVENTOR(S)   : Kia Silverbrook It is certified that error appears in the above-identified patent and that said Letters Patent is hereby corrected as shown below:

<u>Column 3, lines 38-39 through Column 4, lines 1-30,</u>
Should read:

-- 1. A method of fabricating MEMS devices from a substrate wafer having a series of MEMS devices positioned within a layer of sacrificial material on one side of the substrate wafer, the method comprising the steps of:-
applying a first UV curable adhesive tape to the layer of sacrificial material;
applying a first transparent handle wafer to the first adhesive tape;
performing a wafer thinning operation on a side of the substrate wafer opposed to the side having the layer of sacrificial material;
performing a deep silicon etching operation on said opposed side of the substrate wafer to dice the substrate wafer into chips, so that each chip carries a MEMS device;
applying a second UV curable tape to said opposed side of the substrate;
applying a second transparent handle to the second adhesive tape;
illuminating the first adhesive tape through the first transparent handle wafer to remove the first adhesive tape and the first transparent handle wafer;
performing a removal operation on the layer of sacrificial material to remove the sacrificial material and thus to define individual MEMS elements, each MEMS element being composed of one of the MEMS devices positioned on a respective chip; and
illuminating the second adhesive tape through the second transparent handle wafer so that the elements are released from the second adhesive tape and the second transparent handle wafer. --

Signed and Sealed this

Twenty-eighth Day of January, 2003

JAMES E. ROGAN
*Director of the United States Patent and Trademark Office*